United States Patent [19]

Dingwall

[11] 4,142,197

[45] Feb. 27, 1979

[54] DRAIN EXTENSIONS FOR CLOSED COS/MOS LOGIC DEVICES

[75] Inventor: Andrew G. F. Dingwall, Bridgewater, N.J.

[73] Assignee: RCA Corp., New York, N.Y.

[21] Appl. No.: 892,906

[22] Filed: Apr. 3, 1978

Related U.S. Application Data

[63] Continuation-in-part of Ser. No. 787,700, Apr. 4, 1977, abandoned.

[51] Int. Cl.² ............................................. H01L 29/78
[52] U.S. Cl. ........................................ 357/23; 357/41; 357/46; 357/89
[58] Field of Search ....................... 357/23, 41, 42, 46, 357/89

[56] References Cited
U.S. PATENT DOCUMENTS

3,345,216  10/1967  Rogers .................................... 357/23
3,434,021  3/1969  Hofstein ................................. 357/23

OTHER PUBLICATIONS

Krick et al., "Integratable, Symmetrical, High-Voltage MOSFET Structure," *IBM Technical Disclosure Bulletin*, vol. No. 6, Nov. 1972, pp. 1884-1885.

*Primary Examiner*—Stanley D. Miller, Jr.
*Assistant Examiner*—James W. Davie
*Attorney, Agent, or Firm*—H. Christoffersen; D. S. Cohen; Sanford J. Asman

[57] ABSTRACT

A drain extension which is employed with complementary symmetry metal-oxide semiconductor (COS/MOS) devices which are constructed with a closed geometry gate structure. This drain extension of closed geometry gate structures includes lightly doped regions which surround contacts and heavily doped regions in the areas between concentric gates where there are no contacts.

9 Claims, 4 Drawing Figures

DRAIN EXTENSIONS FOR CLOSED COS/MOS LOGIC DEVICES

This is a continuation-in-part of application serial No. 787,700, filed Apr. 14, 1977, and now abandoned.

The present invention relates to complementary symmetry metal-oxide-semiconductor (COS/MOS) devices.

COS/MOS integrated circuits employ both N channel insulated gate field effect transistors (IGFETs) and P channel IGFETs. Conventionally, a P well is formed in an N type substrate and the N channel IGFETs are formed in the P well. The P channel IGFETs are formed in the substrate outside of the P well.

In one form of COS/MOS integrated circuit which has been described in U.S. patent application Ser. No. 585,874 filed June 11, 1975, now continuation-in-part application Ser. No. 749,410, filed Dec. 10, 1976, entitled INTEGRATED CIRCUIT DEVICES INCLUDING BOTH N-CHANNEL AND P-CHANNEL INSULATED GATE FIELD EFFECT TRANSISTORS, which was invented by the present inventor and is assigned to RCA Corporation, the IGFETs have a closed geometry structure.

COS/MOS integrated circuits formed with IGFETs having a closed geometry structure may be formed in a substrate of bulk silicon predominantly of lightly doped N type conductivity. A P well is formed in the substrate and has an isolation gate formed around it. The isolation gate overlies a channel oxide which is on the surface of the substrate, and it is contiguous with the P well, but it lies outside of the P well over the lightly doped N type substrate. Immediately within the P well and extending to the surface thereof is a highly doped P type region which forms an ohmic contact to the P well. Completely surrounding the isolation gate and contiguous therewith is a highly doped P type region which extends into the N type substrate from the surface thereof and forms the source of at least one P channel transistor lying outside of the P well. Within the P well, at least one N channel transistor is formed with its drain enclosed by its gate and its source surrounding its gate. The source of at least one of the transistors within the P well is formed by a highly doped N type region which extends from the surface of the substrate into the P well and is contiguous with the highly doped P type region which acts as the contact to the P well. The isolation gate referred to above isolates N channel transistors within the P well from P channel transistors outside of the P well. The isolation is accomplished by permanently turning off the P channel IGFET formed by the isolation gate, the P type source lying outside of the isolation gate, and the P type well contact permanently by connecting the isolation gate to the most positive power supply voltage.

Heretofore, a problem with COS/MOS integrated circuits has been to increase the voltage rating of the MOS transistors. Increased voltage ratings are desirable because the speed of operation of the transistors is related to the power supply voltage used to operate the circuit. A problem which has existed with regard to increasing the power supply voltage in COS/MOS circuits relates to the breakdown voltage of the junction formed between the N+ drain region of N channel IGFETs and the underlying P well resulting from the high doping concentration of the drain regions. Accordingly, a practice which is employed in conventional COS/MOS integrated circuits is to provide a lightly doped drain area adjacent to the gate in order to alter the junction doping profile thereby to provide a higher breakdown voltage.

The formation of drain extensions for IGFETs which employ closed gate geometries and include concentric gates is not a trivial problem because the contacts only occupy a portion of the space between the concentric gates. If the entire region between two concentric gates was lightly doped to provide a drain extension, then only those areas of the outer transistor immediately adjacent to the middle contact would be effective in supplying current. The high resistance of the drain extension diffusions would effectively isolate the remaining sections of the transistor. Accordingly, a problem exists in increasing the breakdown voltage of COS/MOS integrated circuit devices which employ closed gate geometries.

Figure 1:
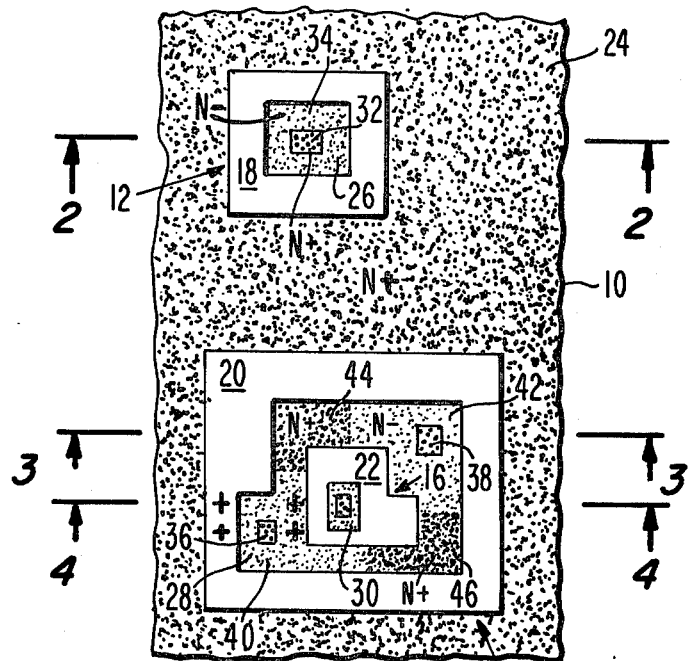
FIG. 1 is a top view of a portion of a COS/MOS integrated circuit of the type employing a closed structure and including the present invention.
Figure 2:
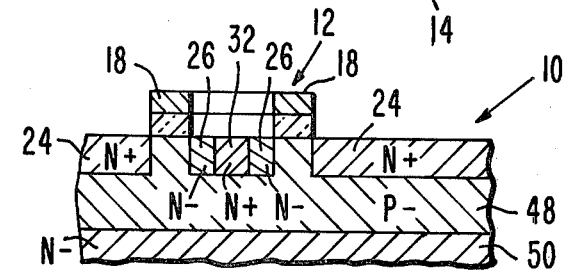
FIG. 2 is a cross-section of the portion of the COS/MOS integrated circuit of FIG. 1 taken along the lines 2—2 of FIG. 1.
Figure 3:
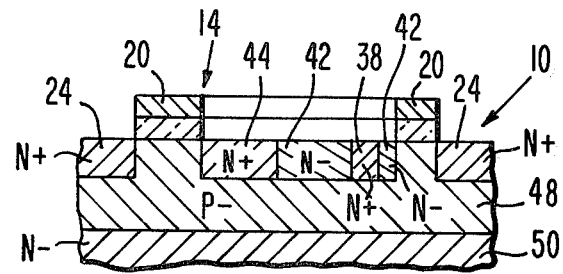
FIG. 3 is a cross-section of the portion of the COS/MOS integrated circuit of FIG. 1 taken along the lines 3—3 of FIG. 1.
Figure 4:
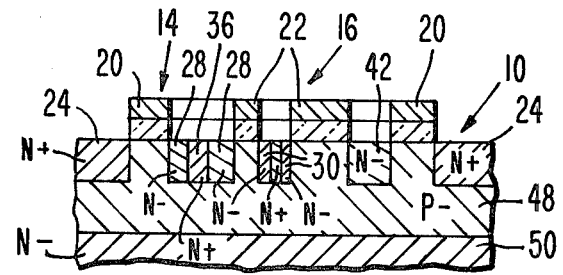
FIG. 4 is a cross-section of the portion of the COS/MOS integrated circuit of FIG. 1 taken along the lines 4—4 of FIG. 1.

Referring to FIGS. 1-4, a portion 10 of a COS/MOS integrated circuit device of the type which employs closed gate geometry insulated gate field effect transistors (IGFETs) 12, 14 and 16 is shown. The three IGFETs 12, 14 and 16 are N-channel devices. The IGFETs 12, 14 and 16 are formed in a P well 48 formed in the N— substrate 50. The transistor 12 has a closed gate geometry gate 18, transistor 14 has a closed geometry gate 20, and transistor 16 has a closed geometry gate 22. The region 24 which surrounds the gates 18 and 20 is an N+ source plane which extends from the surface of the portion 10 down into the P well 48. The N+ source plane 24 provides a common source for transistors 12 and 14. Transistor 16 is formed with its gate 22 completely surrounded by the gate 20 of transistor 14. A region 26 serves as the drain of the transistor 12, a region 28 serves as the drain of the transistor 14 and a region 30 serves as the drain of transistor 16. The region 28 also serves as the source of transistor 16 which is formed concentric with transistor 14. In accordance with the present invention the drain region 26 of transistor 12 has a highly doped portion 32 which is surrounded by a lightly doped portion 34. The highly doped portion 32 is used to facilitate making contacts to the drain region 26. A portion is considered highly doped if its sheet resistance is less than about 50 ohms/square.

A lightly doped portion is comprised of an N-region having a resistivity of about 1000 ohms/square or greater. Since the distance between the edge of the polycrystalline gate 18 and the highly doped N+ portion 32 is relatively small, the resistance developed across the high resistance lightly doped portion 34 is not high enough to significantly affect the operation of the transistor 12. However, the utilization of the lightly doped portion 34 enables the voltage rating of the transistor to be increased from 13 volts to about 20 volts.

The structure comprising the two concentric IGFETs 14, 16 which will be used in such circuits as transmission gates and certain functional gates presents a problem in that the entire drain region 28 of the transistor 14 (also the source of transistor 16) cannot be lightly doped. If the region 28 were completely lightly doped with N— conductivity, only those areas of the outer IGFET 14 immediately adjacent to the contacts 36, 38 would be effective in supplying the high resistance of the remaining N— diffusion which effectively isolates the remaining portions of the IGFET.

In order to provide drain extensions for concentric transistor structures, such as those used in IGFETs 14, 16, it is adequate if the drain extension N-regions surround the contacts 36, 38. The series resistance to the contacts provides a ballast which limits current surges into the contact region. Accordingly, where two contacts are used in the common source-drain region 28 they should each be surrounded by an N— region 40, 42 respectively. The other portions 44, 46 of the common source-drain 28 are highly doped N+ regions in order to allow current to flow through the entire active areas of the source-drain region 28.

In order to manufacture the integrated circuit 10 one starts with a lightly doped substrate 50 of N-conductivity type. Using a first photomask (not shown), a P well 48 is defined and acceptor impurities are introduced into the P well 48 by any suitable means, such as by diffusing or ion implantation. Thereafter, an oxide is grown over the surface of the substrate and a conductive layer is formed on the surface of the oxide to act as the gates of the various devices. The conductive layer is preferably a polycrystalline silicon layer which may be deposited by any well known method. Then, the polycrystalline silicon gates and the underlying oxide layers are defined using a second photomask, and the remaining portions of the polycrystalline silicon and oxide layers are removed exposing the surface of the substrate 50. Using additional photomasks and standard photolithographic techniques, the N—, N+, P— and P+ regions which comprise the drain extensions, ohmic contacts and source planes are defined. Impurities are introduced into the substrate by the techniques of diffusion and/or ion implantation. In particular, it has been found that to be beneficial to use the various gates as masks and to ion implant impurities into the surface of the substrate thereby assuring that the gates are properly aligned with the sources and drains while allowing the gates to become conductive as a result of the ion implantation into the polycrystalline silicon. In view of the fact that the techniques of photolithography, diffusion and ion implantation are already well known in the art, further explanation herein is not required.

Another important application of the present invention which is illustrated by the contacts 36, 38 in the common source-drain region 28 is that the source-drain region may be used as a "tunnel" in order that a low resistance path be provided through the source-drain region 28 between the contacts 36, 38.

What is claimed is:

1. An improved intergrated circuit comprising at least one closed geometry IGFET of the type comprising:
   (a) a semiconductor substrate region of a first conductivity type;
   (b) a pair of spaced regions having a conductivity type opposite that of said substrate region and extending into said substrate region wherein one of said spaced regions completely surrounds the other one of said spaced regions, the surrounding region being the source of said IGFET and the surrounded region being the drain of said IGFET;
   (c) a gate insulating layer on the surface of said substrate region extending over said substrate region between said pair of spaced regions; and
   (d) a conductive gate region overlying said gate insulating layer,
   wherein the improvement comprises a highly doped ohmic contact region of the same conductivity type as said spaced regions which highly doped ohmic contact region is more highly doped than the surrounded one of said spaced regions and which is formed within the surrounded one of said spaced regions and which is surrounded by a lightly doped portion of said surrounded one of said spaced regions, which portion is more lightly doped than the balance of said surrounded one of said spaced regions.

2. The integrated circuit of claim 1 wherein said lightly doped portion has a sheet resistivity of at least 1000 ohms per square.

3. The integrated circuit of claim 2 wherein said highly doped ohmic contact region has a sheet resistivity of less than 50 ohms per square.

4. The integrated circuit of claim 3 further comprising at least one additional highly doped ohmic contact region surrounded by a lightly doped portion, both ohmic contact regions being formed within the same spaced region whereby an electrical path will be formed between said ohmic contact regions.

5. An improved integrated circuit comprising at least a pair of concentrically formed, closed, geometry IGFETs of the type comprising:
   (a) a semiconductor substrate region of a first conductivity type;
   (b) first, second and third spaced regions having a conductivity type opposite that of said substrate region and extending into said substrate region, wherein the first of said spaced regions completely surrounds the second and third ones of said spaced regions, and said second one of said spaced regions completely surrounds said third one of said spaced regions;
   (c) a first insulating layer on the surface of said substrate region extending over said substrate region between said first and second of said spaced regions;
   (d) a second insulating layer on the surface of said substrate region extending over said substrate region between the second and third of said spaced regions; and
   (e) a conductive region overlying each of said insulating regions,
   wherein the improvement comprises a highly doped ohmic contact region of the same conductivity type as said spaced regions which highly doped ohmic contact region is more highly doped than said second and said third ones of said spaced regions and which is formed within the second spaced region and which ohmic contact is surrounded by a lightly doped portion of said second spaced region, which portion is more lightly doped than the balance of said second spaced region.

6. The integrated circuit of claim 5 further comprising a highly doped region of the same conductivity type as said spaced regions which highly doped region is formed in said second spaced region and extends along the surface of said second spaced region between said first insulating layer and said second insulating layer.

7. The integrated circuit of claim 5 wherein said lightly doped region has a sheet resistivity of at least 1000 ohms per square.

8. The integrated circuit of claim 7 wherein said highly doped ohmic contact has a sheet resistivity of less than 50 ohms per square.

9. The integrated circuit of claim 8 further comprising at least one additional highly doped ohmic contact region surrounded by an additional lightly doped portion formed in said second spaced region whereby an electrical path is formed between said ohmic contact regions.

* * * * *

UNITED STATES PATENT AND TRADEMARK OFFICE
CERTIFICATE OF CORRECTION

PATENT NO. : 4,142,197

DATED : February 27, 1979

INVENTOR(S) : Andrew Gordon Francis Dingwall

It is certified that error appears in the above-identified patent and that said Letters Patent is hereby corrected as shown below:

Column 3, line 61, "intergrated" should be --integrated--.

Signed and Sealed this

Twenty-sixth Day of June 1979

[SEAL]

Attest:

RUTH C. MASON
Attesting Officer

DONALD W. BANNER
Commissioner of Patents and Trademarks